United States Patent
Na

(10) Patent No.: US 9,985,083 B2
(45) Date of Patent: May 29, 2018

(54) ORGANIC LIGHT EMITTING DISPLAY DEVICE AND METHOD FOR MANUFACTURING THE SAME

(71) Applicant: Samsung Display Co., Ltd., Yongin-Si, Gyeonggi-Do (KR)

(72) Inventor: Ji Su Na, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days. days.

(21) Appl. No.: 15/628,198

(22) Filed: Jun. 20, 2017

(65) Prior Publication Data

US 2018/0006100 A1 Jan. 4, 2018

(30) Foreign Application Priority Data

Jul. 1, 2016 (KR) ........................ 10-2016-0083464

(51) Int. Cl.
*H01L 27/32* (2006.01)
*H01L 51/56* (2006.01)
*H01L 27/12* (2006.01)

(52) U.S. Cl.
CPC ...... *H01L 27/3262* (2013.01); *H01L 27/3213* (2013.01); *H01L 27/3246* (2013.01); *H01L 27/3248* (2013.01); *H01L 27/3265* (2013.01); *H01L 51/56* (2013.01); *H01L 27/124* (2013.01)

(58) Field of Classification Search
CPC ............... H01L 27/124; H01L 27/3262; H01L 27/3265; H01L 27/3213; H01L 27/3246; H01L 27/3248; H01L 51/56
See application file for complete search history.

(56) References Cited

U.S. PATENT DOCUMENTS

| 7,592,620 | B2 | 9/2009 | Kim |
| 7,692,185 | B2 | 4/2010 | Suh et al. |
| 7,719,496 | B2 | 5/2010 | Ahn et al. |
| 7,910,401 | B2 | 3/2011 | Suh et al. |
| 8,318,533 | B2 | 11/2012 | Ahn et al. |
| 2008/0079005 | A1* | 4/2008 | Tseng .................. H01L 27/3272 257/72 |

FOREIGN PATENT DOCUMENTS

| JP | 4849821 B2 | 10/2011 |
| KR | 10-2007-0047980 A | 5/2007 |
| KR | 10-2007-0063785 A | 6/2007 |
| KR | 10-0787461 B1 | 12/2007 |
| KR | 10-1155903 B1 | 6/2012 |

* cited by examiner

*Primary Examiner* — Fei Fei Yeung Lopez
(74) *Attorney, Agent, or Firm* — Innovation Counsel LLP

(57) ABSTRACT

Provided are an organic light emitting display device and method for manufacturing the same. According to an aspect of the present inventive concept, an organic light emitting display device including: a substrate; a common power line, a first drain electrode, and a second drain electrode each disposed on the substrate; a semiconductor pattern layer connected to the common power line and the second drain electrode; a gate electrode overlapping the semiconductor pattern layer; and an anode electrode connected to the second drain electrode. The semiconductor pattern layer, the gate electrode and the first drain electrode all overlap.

20 Claims, 14 Drawing Sheets

ORGANIC LIGHT EMITTING DISPLAY DEVICE AND METHOD FOR MANUFACTURING THE SAME

CROSS-REFERENCE TO RELATED APPLICATION

This application claims priority from, and the benefit of, Korean Patent Application No. 10-2016-0083464 filed on Jul. 1, 2016 in the Korean Intellectual Property Office, the disclosure of which is incorporated herein by reference in its entirety.

BACKGROUND

1. Technical Field

The present inventive concept relates generally to display devices, and more specifically to organic light emitting display devices and methods for manufacturing the same.

2. Description of the Related Art

The importance of display devices is increasing along with the development of multimedia. Accordingly, various kinds of display devices such as liquid crystal displays (LCDs), organic light emitting displays (OLEDs) and the like have found wide acceptance.

Among these display devices, an organic light emitting display device (OLED) has received much attention as a next generation display device due to its wide viewing angle, excellent contrast ratio, and fast response speed. An organic light emitting layer includes an emission layer made of an organic material interposed between an anode electrode and a cathode electrode. When an anode voltage and a cathode voltage are applied respectively to the anode electrode and cathode electrode, holes injected from the anode electrode move to the emission layer via a hole injection layer and a hole transport layer, and electrons move from the cathode electrode to the emission layer via the electron injection layer and electron transport layer. These electrons and holes are recombined in the emission layer to form excitons. The excitons change from an excited state to a ground state to emit light, thereby displaying images.

SUMMARY

An embodiment of the present inventive concept provides an organic light emitting display device in which a driving transistor is prevented from being affected by static electricity generated from a lower portion of a substrate.

Another embodiment of the present inventive concept provides an organic light emitting display device in which mura stain is prevented from being seen by static electricity generated from a lower portion of a substrate.

However, embodiments of the present inventive concept are not restricted to those set forth herein. Other embodiments of the present inventive concept which are not mentioned herein will become more apparent to a person skilled in the art to which the present inventive concept pertains by referencing the detailed description of the present inventive concept given below.

According to an aspect of the present inventive concept, there is provided an organic light emitting display device including: a substrate; a common power line, a first drain electrode, and a second drain electrode each disposed on the substrate; a semiconductor pattern layer connected to the common power line and the second drain electrode; a gate electrode overlapping the semiconductor pattern layer; and an anode electrode connected to the second drain electrode, wherein the semiconductor pattern layer, the gate electrode and the first drain electrode all overlap.

One end of the semiconductor pattern layer may contact the second drain electrode and another end of the semiconductor pattern layer may contact the common power line.

A part of the common power line, the second drain electrode, and the semiconductor pattern layer may be parts of a driving transistor.

A channel area may be formed in a region in which the semiconductor pattern layer and the gate electrode overlap, and the channel area may completely overlap the first drain electrode.

The anode electrode may overlap the first drain electrode.

The anode electrode and the first drain electrode may form a capacitor.

The second drain electrode may contact the semiconductor pattern layer and the anode electrode.

The common power line, the first drain electrode, and the second drain electrode may be disposed on the same layer.

The gate electrode and the anode electrode may be disposed on the same layer.

The organic light emitting display device may further include a pixel defining layer exposing at least a part of the anode electrode.

According to another aspect of the present inventive concept, there is provided an organic light emitting display device including a substrate; and a plurality of pixels defined on the substrate, wherein the pixels may include a plurality of sub pixels, and the sub pixels include a common power line, a first drain electrode, and a second drain electrode each disposed on the substrate; a semiconductor pattern layer connected to the common power line and the second drain electrode; a gate electrode overlapping the semiconductor pattern layer; and an anode electrode connected to the second drain electrode, wherein the semiconductor pattern layer, the gate electrode and the first drain electrode all overlap.

The pixels may include four sub pixels, and the four subpixels may collectively be configured to emit each of a red color, a green color, a blue color, and a white color.

A channel area may be formed in a region in which the semiconductor pattern layer and the gate electrode overlap, and the channel area may completely overlap the first drain electrode.

The common power line, the first drain electrode, and the second drain electrode may be disposed on the same layer.

The anode electrode and the first drain electrode may form a capacitor.

The gate electrode and the anode electrode may be disposed on the same layer.

According to still another aspect of the present inventive concept, there is provided a method for manufacturing an organic light emitting display device, the method including: forming a common power line, a first drain electrode, and a second drain electrode on a substrate; forming a semiconductor pattern layer connected to the common power line and the second drain electrode; forming a gate electrode overlapping the semiconductor pattern layer; and forming an anode electrode connected to the second drain electrode, wherein the semiconductor pattern layer, the gate electrode and the first drain electrode all overlap.

A channel area may be formed in a region in which the semiconductor pattern layer and the gate electrode overlap, and the channel area may completely overlap the first drain electrode.

The anode electrode and the first drain electrode may form a capacitor.

The gate electrode and the anode electrode may be disposed on the same layer.

The embodiments of the present inventive concept may at least provide effects described below.

Deterioration of characteristics caused by static electricity from an external source may be sensed in an organic light emitting display device.

Mura stain is prevented from being seen by static electricity in an organic light emitting display device.

However, effects of the present inventive concept are not restricted to the exemplary embodiments set forth herein and more diverse effects are included in this description.

DETAILED DESCRIPTION OF THE EMBODIMENTS

Figure 1:
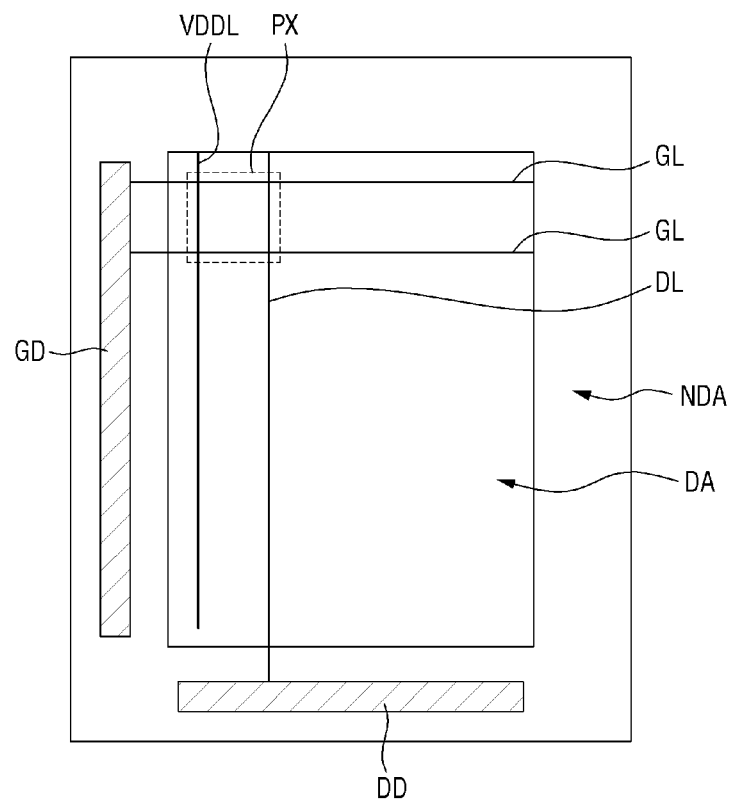
FIG. 1 is a layout diagram illustrating an organic light emitting display device according to an embodiment of the present inventive concept.

The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element. The various drawings are not necessarily to scale. All numerical values are approximate, and may vary. All examples of specific materials and compositions are to be taken as nonlimiting and exemplary only. Other suitable materials and compositions may be used instead.

Hereinafter, preferred embodiments of the present invention will be described in detail with reference to the attached drawings.

Figure 2:
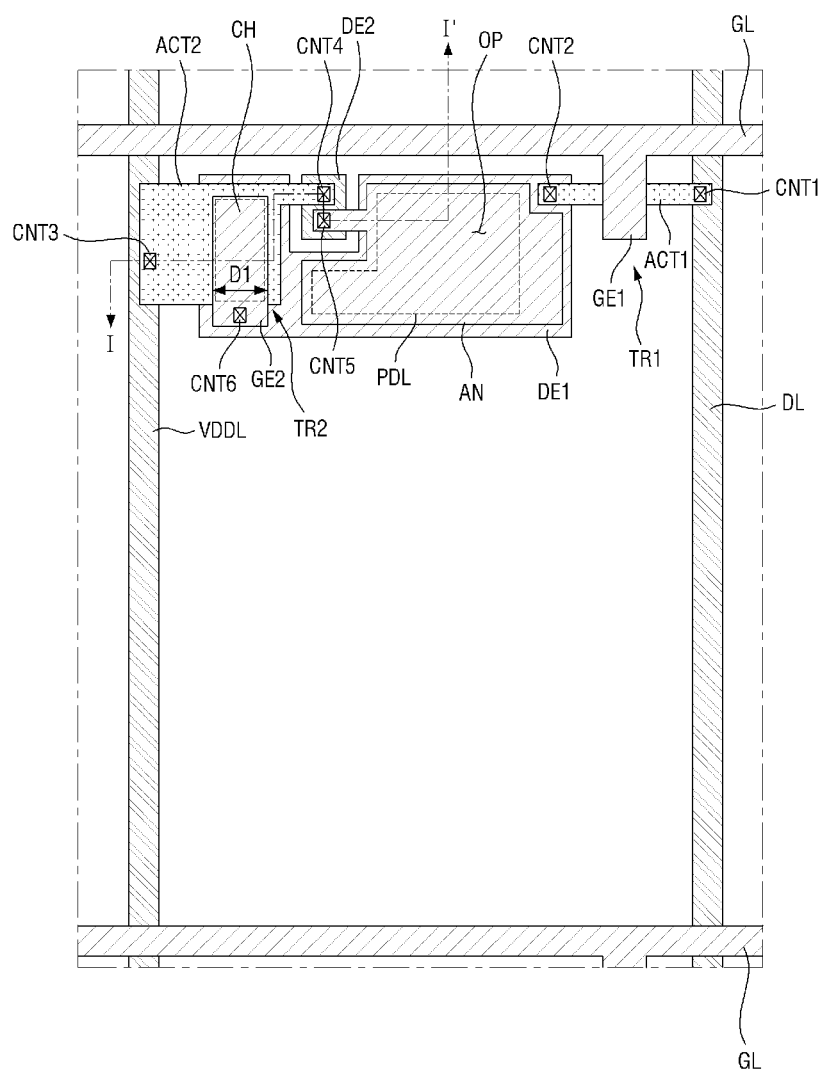
FIG. 2 is an enlarged view of a portion of FIG. 1.
Figure 3:
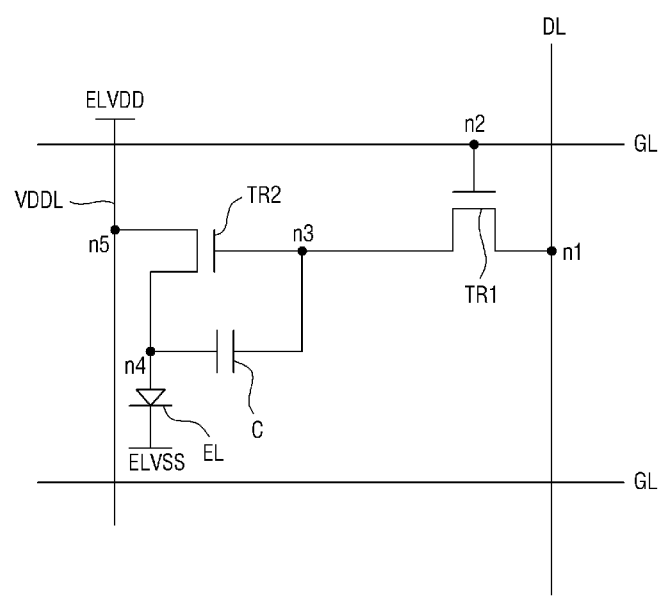
FIG. 3 is an equivalent circuit diagram illustrating an organic light emitting display device according to an embodiment of the present inventive concept.

FIG. 1 is a layout diagram illustrating an organic light emitting display device according to an embodiment of the present inventive concept. FIG. 2 is an enlarged view of a portion of FIG. 1. FIG. 3 is an equivalent circuit diagram illustrating an organic light emitting display device according to an embodiment of the present inventive concept. Referring to FIG. 1 to FIG. 4, an organic light emitting display device according to an embodiment of the present inventive concept may include a substrate 500; a common power line VDDL, a first drain electrode DE1, and a second drain electrode DE2 disposed on the substrate 500; a semiconductor pattern layer ACT2 connected to the common power line VDDL and the second drain electrode DE2; a gate electrode GE2 overlapping the semiconductor pattern layer ACT2; and an anode electrode AN connected to the second drain electrode DE2.

Referring to FIG. 1, the organic light emitting display device according to an embodiment of the present inventive concept may include a display area DA in which an image is displayed, and a non-display area NDA surrounding, or enclosing an outer periphery of, the display area DA.

The non-display area NDA may have various signal lines disposed therein to enable the display area DA to display an image. A gate driving unit GD and/or a data driving unit DD may be disposed in the non-display area NDA.

The gate driving unit GD may provide a signal to a gate line GL disposed in the display area. The data driving unit DD may provide a signal to a data line DL disposed in the display area.

Although the gate driving unit GD and the data driving unit DD are illustrated as being independently formed in FIG. 1, the two units may instead be integrally formed in another embodiment.

In still another embodiment, either the gate driving unit or the data driving unit may be omitted.

The gate line GL extends in a first direction and may be disposed in the display area DA. The gate line GL may extend from the gate driving unit GD disposed in the non-display area NDA. The first direction may be, for example, a horizontal direction as shown in FIG. 1.

The data line DL intersects the gate line GL and may also be disposed in the display area DA. The data line DL may extend in a second direction in the display area DA. The data line may extend from the data driving unit DD disposed in the non-display area NDA. The second direction may be, for example, a vertical direction as shown in FIG. 2.

The common power line VDDL may be disposed in the display area. A common voltage ELVDD may be provided to the common power line VDDL.

The common power line VDDL and the data line DL may be disposed in parallel with each other. That is, the common power line VDDL and the data line DL may extend in parallel with each other with a predetermined gap therebetween.

In one embodiment, the common power line VDDL and the data line DL may be made of the same material. Furthermore, in one embodiment, the common power line VDDL and the data line DL may be formed on the same layer.

One common power line VDDL, the data line DL, and two gate lines GL that are adjacent to each other may collectively define one pixel PX. A plurality of thus-defined pixels PX may be disposed in the display area DA.

FIG. 2 illustrates a detail view of one pixel PX of FIG. 1.

Referring to FIG. 2, one pixel PX may include at least two transistors TR1 and TR2.

A first semiconductor pattern layer ACT1 may be disposed on the data line DL and connected thereto. That is, one side of the first semiconductor pattern layer ACT1 may contact the data line DL through a first contact, or contact hole, CNT1.

The other side of the first semiconductor pattern layer ACT1 may be connected to the first drain electrode DE1. That is, the other side of the first semiconductor pattern layer ACT1 may contact the first drain electrode DE1 through a second contact, or contact hole, CNT2.

A first gate electrode GE1 may be disposed on the first semiconductor pattern layer ACT1. The first gate electrode GE1 may be branched from the gate line GL.

The first gate electrode GE1 may be interposed between the data line DL and the first drain electrode DE1, and cover at least a part of the first semiconductor pattern layer ACT1.

A gate insulation layer GI may be interposed between the first gate electrode GE1 and the first semiconductor pattern layer ACT1 (not shown in FIG. 2). That is, the first semiconductor pattern layer ACT1 and the first gate electrode GE1 may be insulated from each other by the gate insulation layer GI.

A part of the data line DL described above, the first drain electrode DE1, the first semiconductor pattern layer ACT1, and the first gate electrode GE1 may collectively form the first transistor TR1. The first transistor TR1 may function as a switching element in the organic light emitting display device according to an embodiment of the present inventive concept.

In one embodiment, the first drain electrode DE1 may have a flat plate shape. The second drain electrode DE2 may be disposed to be adjacent to the first drain electrode DE1. The size of the second drain electrode DE2 may be relatively smaller than that of the first drain electrode DE1. In one embodiment, the first drain electrode DE1 may be disposed to envelop or surround a part of the second drain electrode DE2.

The first drain electrode DE1 and the second drain electrode DE2 may be spaced apart from each other by a predetermined gap, and may not directly contact each other.

As described above, the first semiconductor pattern layer ACT1 may be disposed at one side of the first drain electrode DE1.

The second semiconductor pattern layer ACT2 may be disposed at the other side of the first drain electrode DE1.

One side of the second semiconductor pattern layer ACT2 may be connected to the second drain electrode DE2, and the other side of the second semiconductor pattern layer ACT2 may be connected to the common power line VDDL. That is, the second semiconductor pattern layer ACT2 may contact the common power line VDDL through a third contact, or contact hole, CNT3.

The second semiconductor pattern layer ACT2 may be connected to the second drain electrode DE2. That is, the second semiconductor pattern layer ACT2 may contact the second drain electrode DE2 through a fourth contact, or contact hole, CNT4.

The second semiconductor pattern layer ACT2 may partially overlap the first drain electrode DE1. That is, the second semiconductor pattern layer ACT2 may be disposed to cover a part of the first drain electrode DE1.

The second gate electrode GE2 may be disposed on the second semiconductor pattern layer ACT2. The second gate electrode GE2 may partially overlap the second semiconductor pattern layer ACT2. As described above, the second semiconductor pattern layer ACT2 may partially overlap the first drain electrode DE1. When the second gate electrode GE2 partially overlaps the second semiconductor pattern layer ACT2, the first drain electrode DE1, the second semiconductor pattern layer ACT2, and the second gate electrode GE2 may be sequentially stacked into layers, and partially overlap each other.

One end of the second gate electrode GE2 may be connected to the first drain electrode DE1. That is, the second gate electrode GE2 may contact the first drain electrode DE1 through a sixth contact, or contact hole, CNT6.

As described above, a part of the common power line VDDL, the second drain electrode DE2, the second semiconductor pattern layer ACT2, and the second gate electrode GE2 may collectively form the second transistor TR2. The second transistor TR2 may be a driving transistor in the organic light emitting display device according to an embodiment of the present inventive concept.

A region in which the second gate electrode GE2 and the second semiconductor pattern layer ACT2 overlap may be a channel area CH in which a channel is formed.

In one embodiment, a region in which the second gate electrode GE2 overlaps the second semiconductor pattern layer ACT2 may in turn overlap the first drain electrode DE1. That is, the channel area CH may overlap the first drain electrode DE1. In one embodiment, the channel area CH may be disposed to completely overlap the first drain electrode DE1. When the channel area CH overlaps the first drain electrode DE1, static electricity generated from a lower portion of the substrate 500 may be prevented from affecting an operation of the second transistor TR2. That is, static electricity generated from a lower portion of the substrate 500 may otherwise affect the second transistor TR2 such that mura stain may be seen, and the first drain electrode DE1 may prevent the static electricity from affecting an operation of the second transistor TR2. That is, the first drain electrode DE1 may function as a protective layer.

The anode electrode AN may be disposed at the center of the first drain electrode DE1. That is, the anode electrode AN may be disposed to overlap the first drain electrode DE1. An interlayer insulation layer ILD may be disposed between the anode electrode AN and the first drain electrode DE1. That is, the anode electrode AN and the first drain electrode DE1 may be insulated from each other by the interlayer insulation layer ILD, to form a capacitor C (refer to FIG. 3 and FIG. 4).

One end of the anode electrode AN may be connected to the second drain electrode DE2. That is, one end of the anode electrode AN may contact the second drain electrode DE2 via the fifth contact, or contact hole, CNT5. Accordingly, the fourth contact CNT4 and the fifth contact CNT5 may be formed on the second drain electrode DE2. Thus, the second semiconductor pattern layer ACT2, the second drain electrode DE2, and the anode electrode AN may be electrically connected.

A pixel defining layer PDL may be disposed on the anode electrode AN. The pixel defining layer PDL may expose at least a part of the anode electrode AN, and may be formed on the entire surface of the display area DA.

That is, an opening OP may be formed over the anode electrode AN by the pixel defining layer PDL.

A method of operating the organic light emitting display device will now be described with reference to FIG. 3.

When a gate signal is applied from the gate line GL through a second node n2, the first transistor TR1 may be turned on. Three terminals of the first transistor TR1 may include the first gate electrode GE1, the first drain electrode DE1, and a part of the data line DL, shown in FIG. 2. Thus, when the first transistor TR1 is turned on, a data signal may be transmitted to the first drain electrode DE1 from the data line DL. As described above, the first transistor TR1 may be a switching element.

When the first transistor TR1 is turned on, a data signal may be transmitted from the data line DL to a third node n3 through the first node n1. The signal transmitted to the third node n3 may be transmitted to the second transistor TR2 and/or the capacitor C.

The signal transmitted to the second transistor TR2 may turn on the second transistor TR2.

Three terminals of the second transistor TR2 may include the second gate electrode GE2, the second drain electrode DE2, and a part of the common power line VDDL, shown in FIG. 2.

When the second transistor TR2 is turned on, the common voltage ELVDD may be transferred from the fifth node n5 to the fourth node n4 through the common power line VDDL. In this case, the common voltage may be provided to an organic light emitting element EL through the fourth node n4. In other words, with reference to FIG. 2, the common voltage ELVDD is transferred from the common power line VDDL to the second drain electrode DE2. The common voltage ELVDD transferred to the second drain electrode DE2 may be provided to the anode electrode AN of the organic light emitting element EL.

A signal may be transmitted from the third node n3 to one electrode of the capacitor C. In this case, one electrode of the capacitor C may be the first drain electrode DE1 shown in FIG. 2.

The other electrode of the capacitor C may be the anode electrode AN shown in FIG. 2. That is, in one embodiment, the anode electrode AN may function not only as an anode electrode of the organic light emitting element EL but also as the other electrode of the capacitor C.

Figure 4:
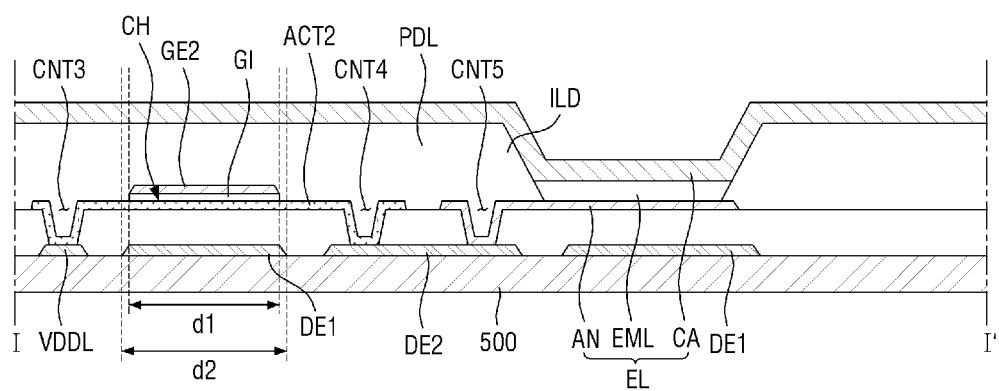
FIG. 4 is a cross-sectional view taken along line I-I' of FIG. 2.

FIG. 4 is a cross-sectional view taken along line I-I' of FIG. 2. A layer structure of the organic light emitting display device according to an embodiment of the present inventive concept will hereinafter be described with reference to FIG. 4.

Referring to FIG. 4, the organic light emitting display device according to an embodiment of the present inventive concept may include the substrate 500.

The substrate 500 may include an insulation substrate. In one embodiment, the insulation substrate may be made of transparent glass having SiO2 as a main component. In another embodiment, the substrate 500 may be made of a plastic material. In still another embodiment, the substrate 500 may be a flexible substrate which can be bent, folded, or rolled.

The common power line VDDL, the first drain electrode DE1, the second drain electrode DE2, and the data line DL may be disposed on the substrate 500 (the data line DL is not shown in FIG. 4).

The common power line VDDL, the first drain electrode DE1, the second drain electrode DE2, and the data line DL may each include at least one selected from a metal, an alloy, metal nitride, conductive metal oxide, and a transparent conductive material. The common power line VDDL, the first drain electrode DE1, the second drain electrode DE2, and the data line DL may each have a single-layer or multi-layer structure, and may each be made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), or the like. Furthermore, an alloy formed of the above-mentioned metal and one or more elements selected from titanium (Ti), zirconium (Zr), tungsten (W), tantalum (Ta), niobium (Nb), platinum (Pt), hafnium (Hf), oxygen (O), and nitrogen (N) can also be applied.

In one embodiment, the common power line VDDL, the first drain electrode DE1, the second drain electrode DE2, and the data line DL may be made of the same material, and disposed on the same layer.

The interlayer insulation layer ILD may be disposed on the common power line VDDL, the first drain electrode DE1, the second drain electrode DE2, and the data line DL.

The interlayer insulation layer ILD may be made of one material or a mixture of two or more materials selected from an inorganic insulation material such as silicon oxide (SiOx) and silicon nitride (SiNx), and/or an organic insulation material such as benzocyclobutene (BCB), an acrylic material, and polyimide.

The interlayer insulation layer ILD may include a plurality of contacts. The plurality of contacts may penetrate through the interlayer insulation layer ILD so as to expose at least a part of the electrodes disposed beneath the interlayer insulation layer ILD.

More specifically, as shown in FIG. 4, the third contact CNT3 may expose the common power line VDDL, and the fourth contact CNT4 and the fifth contact CNT5 may expose the second drain electrode DE2. Furthermore, although not shown in FIG. 4, the first contact CNT1 may expose a part of the data line DL, and the second contact CNT2 may expose a part of the first drain electrode DE1, as shown in FIG. 2.

Referring back to FIG. 4, the semiconductor pattern layers ACT1 and ACT2 may be disposed on the interlayer insulation layer ILD (only the second semiconductor pattern layer ACT2 is shown in FIG. 4).

The semiconductor pattern layers ACT1 and ACT2 may be made of one material or a mixture of two or more materials selected from amorphous silicon, polycrystalline silicon, or monocrystalline silicon. In another embodiment, the semiconductor pattern layers ACT1 and ACT2 may include an oxide semiconductor.

When the semiconductor pattern layers ACT1 and ACT2 are oxide semiconductors, the semiconductor pattern layers ACT1 and ACT2 may include zinc oxide (ZnO). Furthermore, each semiconductor pattern layer ACT1, ACT2 may be doped with one or more ion selected from gallium (Ga), indium (In), stannum (Sn), zirconium (Zr), hafnium (Hf), cadmium (Cd), silver (Ag), copper (Cu), germanium (Ge), gadolinium (Gd), titanium (Ti), and vanadium (V). For example, the semiconductor pattern layers ACT1 and ACT2, when formed as oxide semiconductors, may include one or more selected from ZnO, ZnGaO, ZnInO, ZnSnO, GaInZnO, CdO, InO, GaO, SnO, AgO, CuO, GeO, GdO, HfO, TiZnO, InGaZnO, and InTiZnO.

The second semiconductor pattern layer ACT2 may contact the common power line VDDL through the third contact CNT3, and contact the second drain electrode DE2 through the fourth contact CNT4. That is, as described with reference to FIG. 3, when the second transistor TR is turned on, the second semiconductor pattern layer ACT2 may electrically connect the common power line VDDL and the second drain electrode DE2.

The gate insulation layer GI may be disposed on the semiconductor pattern layers ACT1 and ACT2. As shown in FIG. 4, the gate insulation layer GI may cover at least a part of the second semiconductor pattern layer ACT2, and may insulate the second gate electrode GE2 and the second semiconductor pattern layer ACT2.

The gate insulation layer GI may be made of one material or a mixture of two or more materials selected from an inorganic insulation material such as silicon oxide (SiOx) and silicon nitride (SiNx), and/or an organic insulation material such as benzocyclobutene (BCB), an acrylic material, and polyimide.

The second gate electrode GE2 and the anode electrode AN may be disposed on the gate insulation layer GI and the interlayer insulation layer ILD.

The second gate electrode GE2 may be disposed to overlap the gate insulation layer GI, and may not directly contact the second semiconductor pattern layer ACT2.

The second gate electrode GE2 may overlap the first drain electrode DE1.

As described above, the channel area CH may be formed between the second gate electrode GE2 and the second semiconductor pattern layer ACT2. In one embodiment, the channel area CH may have a width dl narrower than the width of the first drain electrode DE1. In other words, the channel area CH may completely overlap the first drain electrode DE1. When the channel area CH is completely covered by the first drain electrode DE1, the second transistor TR1 may be prevented from being affected by static electricity generated from a lower portion of the substrate 500.

The anode electrode AN may be spaced apart from the second semiconductor pattern layer ACT2 by a predetermined gap, and disposed on the interlayer insulation layer ILD.

One end of the anode electrode AN may be connected to the second drain electrode DE2 through the fifth contact CNT5.

The first drain electrode DE1 may be disposed beneath the anode electrode AN. In other words, the anode electrode AN may be disposed to overlap the first drain electrode DE1.

As described above, the anode electrode AN and the first drain electrode DE1 may form the capacitor C. In other words, the first drain electrode DE1 and the anode electrode AN may form, respectively, one electrode and the other electrode of the capacitor C.

The second gate electrode GE2 and the anode electrode AN may be made of the same material. The second gate electrode GE2 and the anode electrode AN may include, for example, one or more among aluminum (Al)-based metal including an aluminum alloy, silver (Ag)-based metal including a silver alloy, copper (Cu)-based metal including a copper alloy, molybdenum (Mo)-based metal including a molybdenum alloy, chrome (Cr), titanium (Ti), and tantalum (Ta).

In one embodiment, the second gate electrode GE2 and the anode electrode AN may be formed on the same layer.

The pixel defining layer PDL may be disposed on the second semiconductor pattern layer ACT2, the second gate electrode GE2, the interlayer insulation layer ILD, and the anode electrode AN.

The pixel defining layer PDL may be formed on the entire surface of the substrate 500, and may expose at least a part of an upper surface of the anode electrode AN.

An organic emission layer EML may be formed on that part of the anode electrode AN exposed by the pixel defining layer PDL. The organic emission layer EML may be made of a low-molecular or high-molecular organic material.

In one embodiment, the organic emission layer EML may include two or more functional layers.

In one embodiment, the organic emission layer EML may include one or more selected from a hole injection layer, a hole transport layer, an emission layer, an electron transport layer, and an electron injection layer.

A cathode electrode CA may be formed on the organic emission layer EML. The cathode electrode CA may be made of a conductive material having a low work function.

The cathode electrode CA may be a front electrode, and may be formed on the entire surface of the substrate 500.

An organic light emitting display device according to another embodiment of the present inventive concept will hereinafter be described. In the embodiment described hereinafter, identical reference numerals are used to designate identical elements which have been described thus far, and duplicated descriptions thereof will be omitted or abbreviated.

Figure 5:
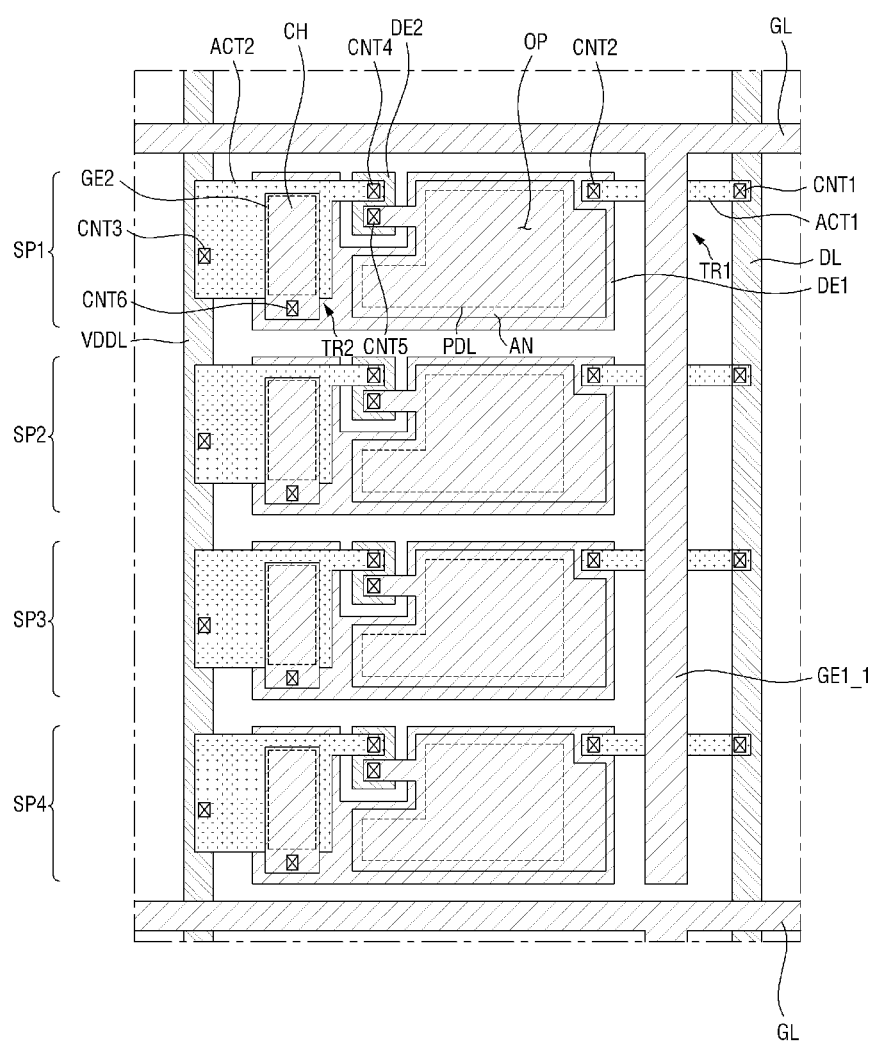
FIG. 5 is a layout diagram illustrating an organic light emitting display device according to another embodiment of the present inventive concept.

FIG. 5 is a layout diagram illustrating an organic light emitting display device according to another embodiment of the present inventive concept.

Referring to FIG. 5, the organic light emitting display device according to another embodiment of the present inventive concept may differ from that of the embodiment described with reference to FIG. 2 in that the former includes a plurality of sub pixels SP.

In one embodiment, the plurality of sub pixels SP may be disposed in one pixel PX. Although FIG. 5 illustrates four sub pixels SP being disposed in one pixel PX, the number of sub pixels SP is not limited thereto. Indeed, any number of sub pixels SP is contemplated.

In the embodiment described with reference to FIG. 5, a first gate electrode GE1_1 may extend to a region adjacent to another gate line GL. That is, the first gate electrode GE1_1 may extend in parallel with the data line DL.

At least two transistors may be disposed in one sub pixel SP1. This may be substantially the same as those described above with reference to FIG. 2. That is, the first transistor TR1 and the second transistor TR2 disposed in one sub pixel SP1 may be substantially the same as those described above with reference to FIG. 2, and thus a detailed description thereof will be omitted.

Thus, at least eight transistors may be disposed in one pixel (at least two transistors per sub pixel).

The first sub pixel SP1 to fourth sub pixel SP4 may emit, respectively, light of different colors. For example, the first sub pixel SP1 to fourth sub pixel SP4 may sequentially emit light of red, green, blue, and white colors. However, this is merely exemplary, and the colors emitted from the first sub pixel SP1 to fourth sub pixel SP4 are not limited thereto. Embodiments of the invention allow for any color to be emitted from any sub pixel.

A method for manufacturing an organic light emitting display device according to some embodiments of the present inventive concept will hereinafter be described. In the embodiment described hereinafter, some components may be identical with those of the organic light emitting display device according to some embodiments of the present inventive concept, and descriptions thereof will thus be omitted to avoid duplicated description.

Figure 6:
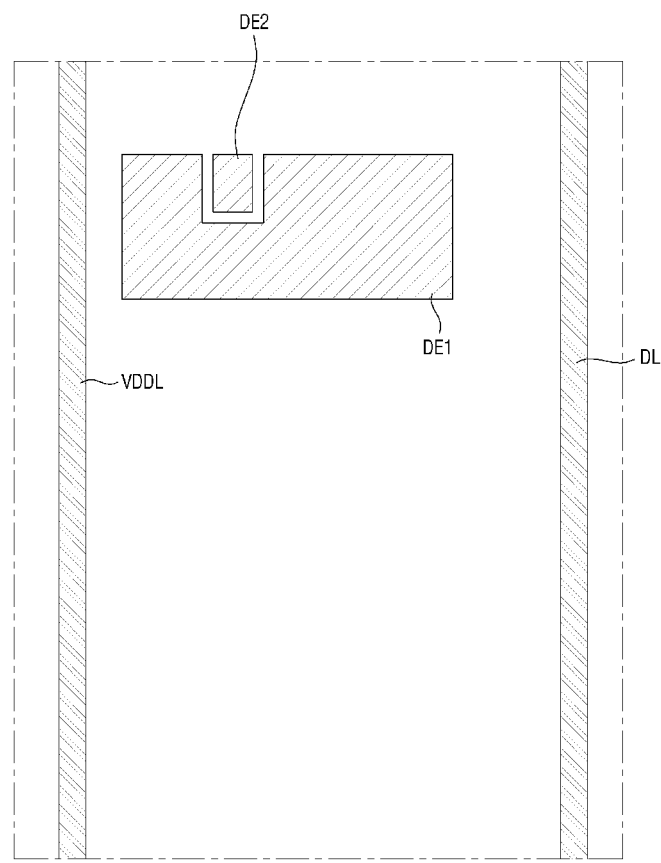
FIG. 6 is a plan view illustrating a method for manufacturing an organic light emitting display device according to an embodiment of the present inventive concept.
Figure 7:
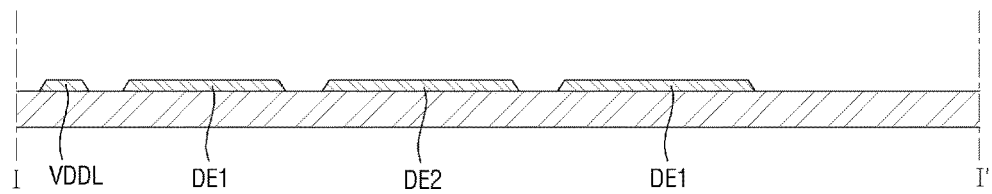
FIG. 7 is a cross-sectional view illustrating a method for manufacturing an organic light emitting display device according to an embodiment of the present inventive concept.
Figure 8:
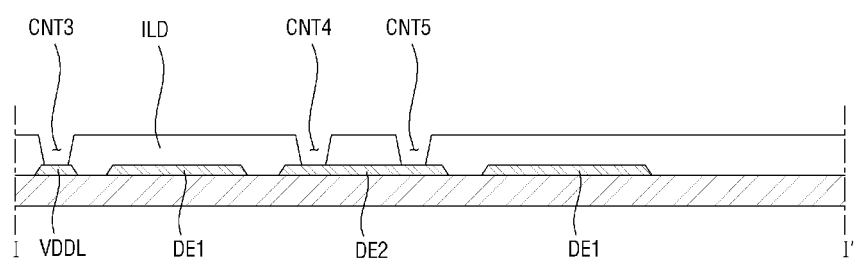
FIG. 8 is a cross-sectional view illustrating a method for manufacturing an organic light emitting display device according to an embodiment of the present inventive concept.
Figure 9:
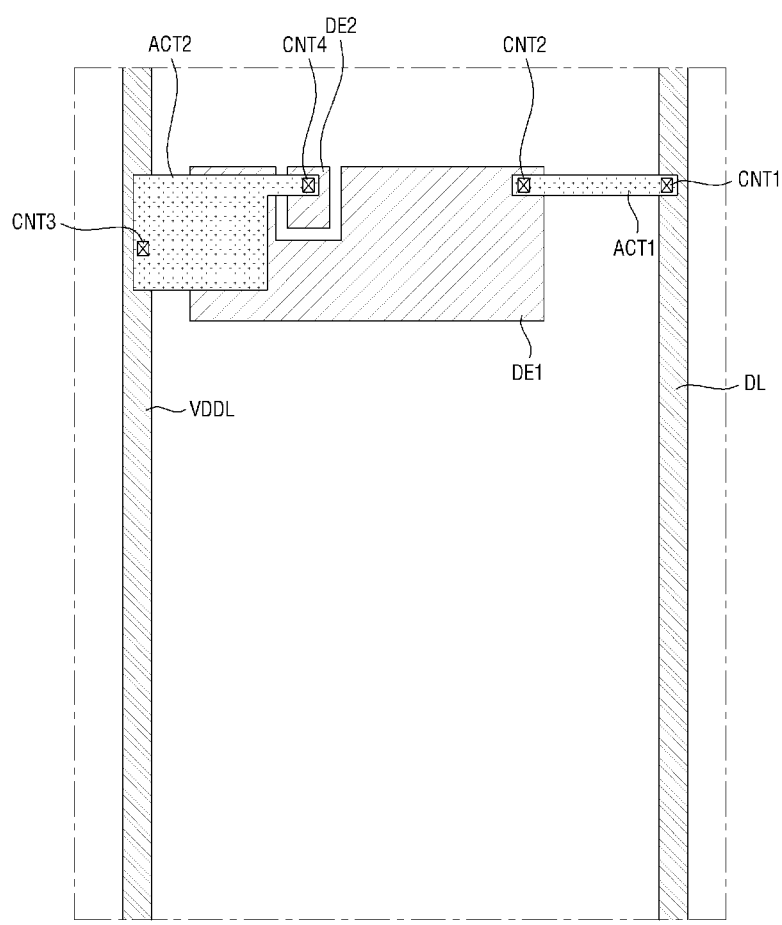
FIG. 9 is a cross-sectional view illustrating a method for manufacturing an organic light emitting display device according to an embodiment of the present inventive concept.
Figure 10:
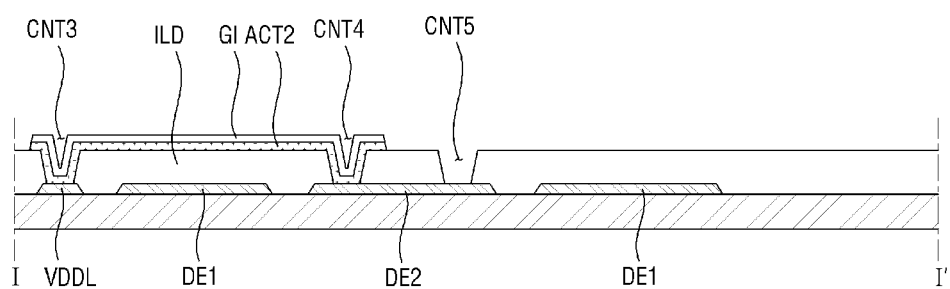
FIG. 10 is a cross-sectional view illustrating a method for manufacturing an organic light emitting display device according to an embodiment of the present inventive concept.
Figure 11:
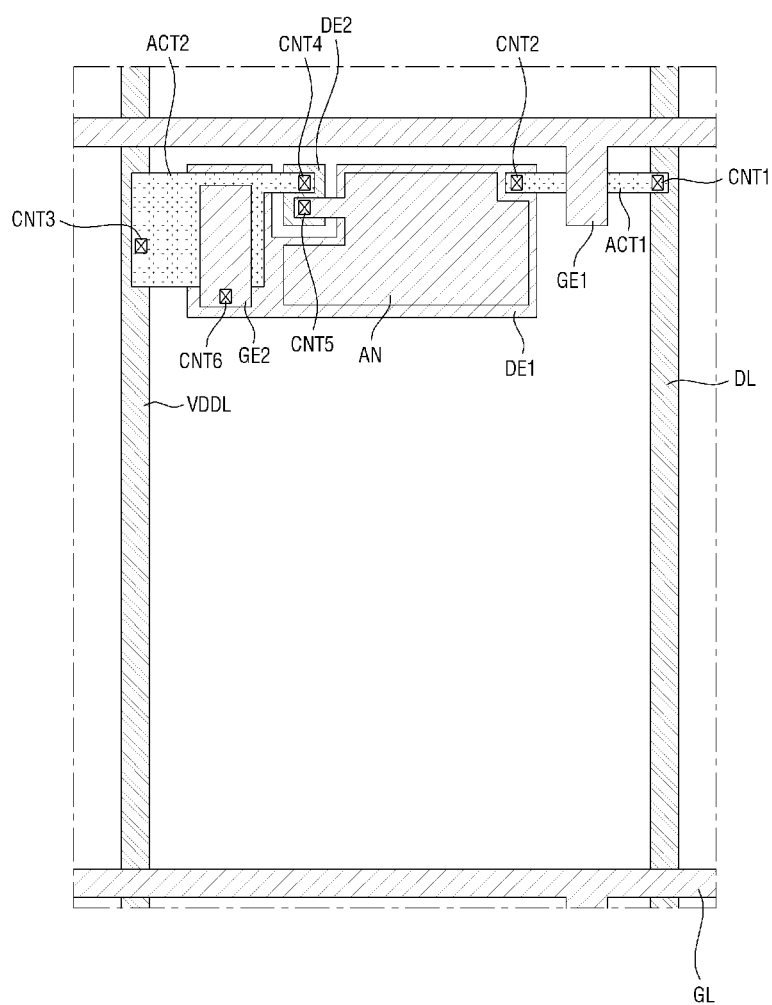
FIG. 11 is a plan view illustrating a method for manufacturing an organic light emitting display device according to an embodiment of the present inventive concept.
Figure 12:
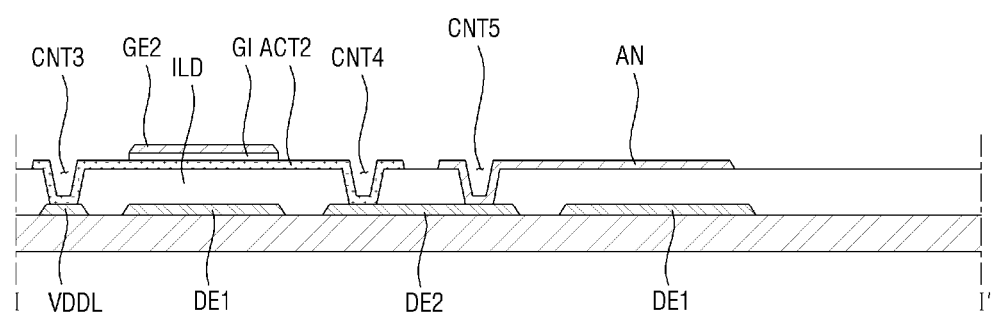
FIG. 12 is a cross-sectional view illustrating a method for manufacturing an organic light emitting display device according to an embodiment of the present inventive concept.
Figure 13:
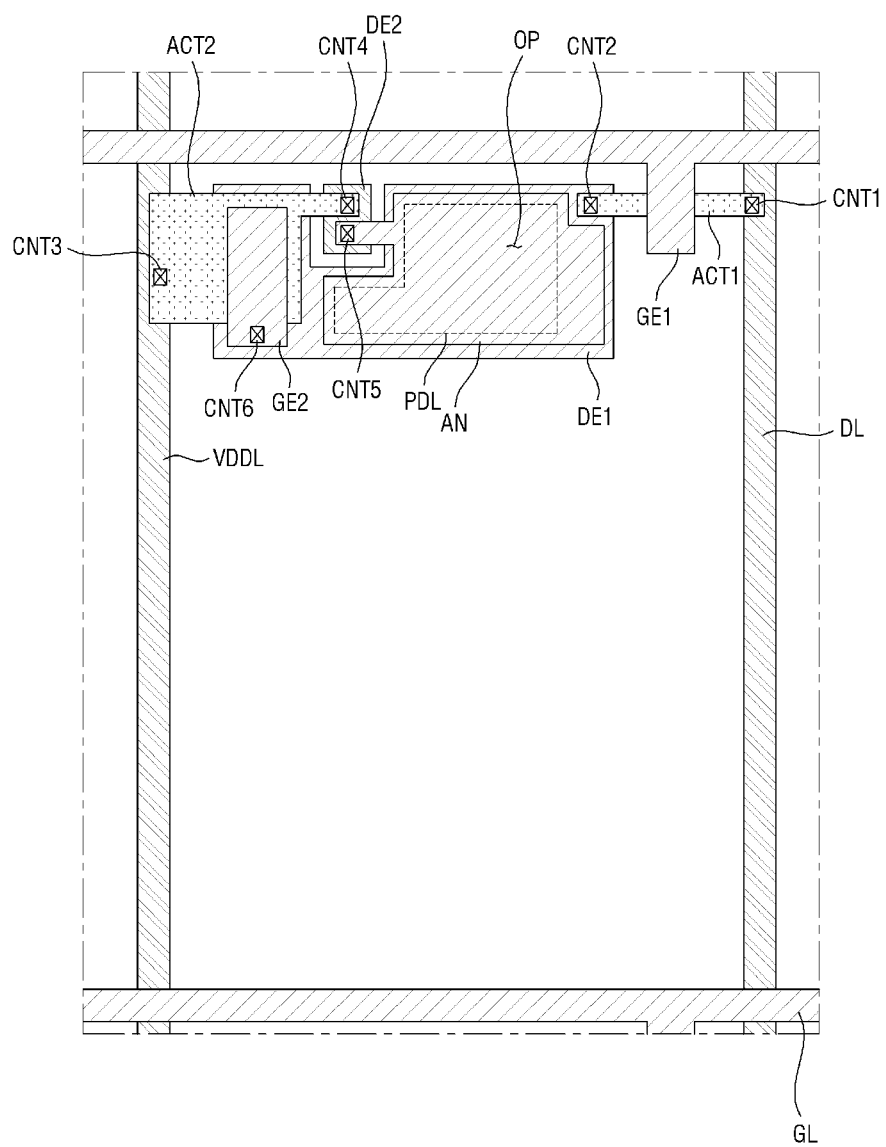
FIG. 13 is a plan view illustrating a method for manufacturing an organic light emitting display device according to an embodiment of the present inventive concept.
Figure 14:
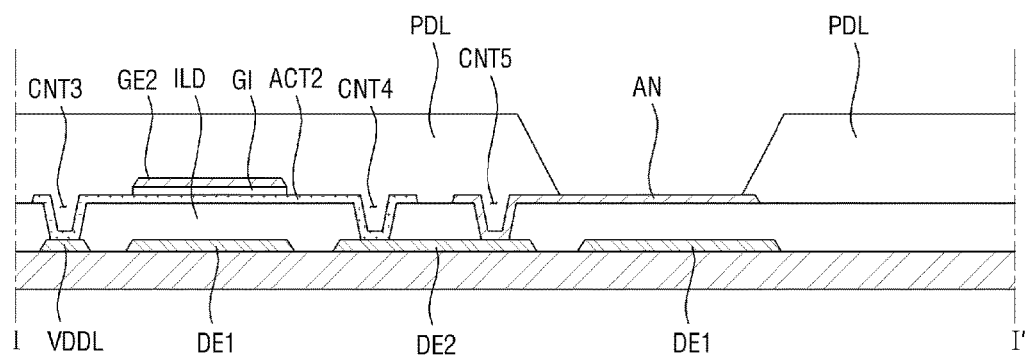
FIG. 14 is a cross-sectional view illustrating a method for manufacturing an organic light emitting display device according to an embodiment of the present inventive concept.

FIG. 6 is a plan view illustrating a method for manufacturing an organic light emitting display device according to an embodiment of the present inventive concept. FIG. 7 is a cross-sectional view illustrating a method for manufacturing an organic light emitting display device according to an embodiment of the present inventive concept. FIG. 8 is a cross-sectional view illustrating a method for manufacturing an organic light emitting display device according to an embodiment of the present inventive concept. FIG. 9 is a cross-sectional view illustrating a method for manufacturing an organic light emitting display device according to an embodiment of the present inventive concept. FIG. 10 is a cross-sectional view illustrating a method for manufacturing an organic light emitting display device according to an embodiment of the present inventive concept. FIG. 11 is a plan view illustrating a method for manufacturing an organic light emitting display device according to an embodiment of the present inventive concept. FIG. 12 is a cross-sectional view illustrating a method for manufacturing an organic light emitting display device according to an embodiment of the present inventive concept. FIG. 13 is a plan view illustrating a method for manufacturing an organic light emitting display device according to an embodiment of the present inventive concept. FIG. 14 is a cross-sectional view illustrating a method for manufacturing an organic light emitting display device according to an embodiment of the present inventive concept.

Referring to FIG. 6 to FIG. 14, a method for manufacturing an organic light emitting display device according to an embodiment of the present inventive concept may include forming the common power line VDDL, the first drain electrode DE1, and the second drain electrode DE2 on the substrate 500 (FIG. 6); forming the semiconductor pattern layer ACT2 connected to the common power line VDDL and the second drain electrode DE2 (FIG. 9); forming the gate electrode GE2 overlapping the semiconductor pattern layer ACT2 (FIG. 11); and forming the anode electrode AN connected to the second drain electrode DE (FIG. 11).

Referring first to FIG. 6 and FIG. 7, a step of forming the common power line VDDL, the first drain electrode DE1, the second drain electrode DE2, and the data line DL on the substrate 500 may be performed.

As described above, the common power line VDDL, the first drain electrode DE1, the second drain electrode DE2, and the data line DL may be made of the same material and disposed on the same layer.

For example, the common power line VDDL, the first drain electrode DE1, the second drain electrode DE2, and the data line DL may be obtained by forming a metal layer on the entire surface of the substrate 500 and patterning the metal layer.

Referring to FIG. 8, a step of forming the interlayer insulation layer ILD on the common power line VDDL, the first drain electrode DE1, the second drain electrode DE2, and the data line DL may be performed. The interlayer insulation layer ILD may be formed on the entire surface of the substrate 500. The interlayer insulation layer ILD may be formed by, for example, one or more methods selected from chemical vapor deposition (CVD), inkjet printing, nozzle printing, and sputtering.

Subsequently, a step of forming a plurality of contacts or holes on the interlayer insulation layer ILD may be performed. The plurality of contacts may penetrate through the interlayer insulation layer ILD so as to expose at least parts of the common power line VDDL, the first drain electrode DE1, the second drain electrode DE2, and the data line DL.

For example, as shown in FIG. 8, in the interlayer insulation layer ILD, the third contact CNT3 may expose the common power line VDDL, and the fourth contact CNT4 and the fifth contact CNT5 may each expose the second drain electrode DE2. Furthermore, although not shown in FIG. 8, the first contact CNT1 may expose a part of the data line DL, and the second contact CNT2 may expose a part of the first drain electrode DE1, as shown in FIG. 2.

Referring next to FIG. 9 and FIG. 10, a step of forming the semiconductor pattern layers ACT2 and ACT1 on the interlayer insulation layer ILD, the common power line VDDL, the first drain electrode DE1, the second drain electrode DE2, and the data line DL may be performed.

More specifically, a step of forming a semiconductor layer on the entire surface of the interlayer insulation layer ILD, the common power line VDDL, the first drain electrode DE1, the second drain electrode DE2, and the data line DL, and forming the gate insulation layer GI on the entire surface of the semiconductor layer may be performed.

In one embodiment, the semiconductor layer and the gate insulation layer GI may be simultaneously etched and patterned. In this case, the semiconductor layer may be patterned so as to form both the first semiconductor pattern layer ACT1 and the second semiconductor pattern layer ACT2.

The gate insulation layer GI may be simultaneously etched with the semiconductor layer, and may thus have a shape the same as those of the semiconductor pattern layers ACT1 and ACT2.

In this case, the second semiconductor pattern layer ACT2 may be connected to the common power line VDDL and the second drain electrode DE2.

More specifically, one end of the second semiconductor pattern layer ACT2 may contact the common power line VDDL through the third contact CNT3, and the other end of the second semiconductor pattern layer ACT2 may contact the second drain electrode DE2 through the fourth contact CNT4.

Referring next to FIG. 11 and FIG. 12, a step of forming the gate electrode GE2 overlapping the second semiconductor pattern layer ACT2, and a step of forming the anode electrode AN connected to the second drain electrode DE2, may be performed.

More specifically, the first gate electrode GE1, the second gate electrode GE2, and the anode electrode AN may be formed on the substrate 500 over the semiconductor pattern layers ACT1 and ACT2, the gate insulation layer GI, and the interlayer insulation layer ILD. That is, the gate electrodes GE1 and GE2 and the anode electrode AN may be made of the same material and disposed on the same layer.

For example, the first gate electrode GE1, the second gate electrode GE2, and the anode electrode AN may be obtained by forming a metal layer on the entire surface of the substrate 500 and simultaneously patterning the metal layer.

In this case, the gate insulation layer GI may be patterned simultaneously with the second gate electrode GE2, and thus may have a shape the same as that of the second gate electrode GE2.

The anode electrode AN may be disposed to overlap the first drain electrode DE1, and one end of the anode electrode AN may contact the second drain electrode DE2 through the fifth contact CNT5.

Referring next to FIG. 13 and FIG. 14, the method for manufacturing an organic light emitting display device according to one embodiment of the present inventive concept may include a step of forming the pixel defining layer PDL on the anode electrode AN. The pixel defining layer PDL may be formed on the entire surface of the substrate 500, and may expose at least a part of an upper surface of the anode electrode AN.

Thus, as described with reference to FIG. 2, the opening OP may be formed in the anode electrode AN.

The organic light emitting display device manufactured by the method for manufacturing an organic light emitting display device according to one embodiment of the present inventive concept may be substantially the same as the organic light emitting display devices according to some embodiments of the present inventive concept described above. However, the scope of the present inventive concept is not limited by the manufacturing method.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation. Various features of the above described and other embodiments can be mixed and matched in any manner, to produce further embodiments consistent with the invention.

What is claimed is:

1. An organic light emitting display device comprising:
   a substrate;
   a common power line, a first drain electrode, and a second drain electrode each disposed on the substrate;
   a semiconductor pattern layer connected to the common power line and the second drain electrode;
   a gate electrode overlapping the semiconductor pattern layer; and
   an anode electrode connected to the second drain electrode,
   wherein the semiconductor pattern layer, the gate electrode and the first drain electrode all overlap.

2. The organic light emitting display device of claim 1, wherein one end of the semiconductor pattern layer contacts the second drain electrode and another end of the semiconductor pattern layer contacts the common power line.

3. The organic light emitting display device of claim 1, wherein a part of the common power line, the second drain electrode, and the semiconductor pattern layer are parts of a driving transistor.

4. The organic light emitting display device of claim 1, wherein a channel area is formed in a region in which the semiconductor pattern layer and the gate electrode overlap, and the channel area completely overlaps the first drain electrode.

5. The organic light emitting display device of claim 1, wherein the anode electrode overlaps the first drain electrode.

6. The organic light emitting display device of claim 1, wherein the anode electrode and the first drain electrode form a capacitor.

7. The organic light emitting display device of claim 1, wherein the second drain electrode contacts the semiconductor pattern layer and the anode electrode.

8. The organic light emitting display device of claim 1, wherein the common power line, the first drain electrode, and the second drain electrode are disposed on the same layer.

9. The organic light emitting display device of claim 1, wherein the gate electrode and the anode electrode are disposed on the same layer.

10. The organic light emitting display device of claim 1, further comprising a pixel defining layer exposing at least a part of the anode electrode.

11. An organic light emitting display device comprising:
    a substrate; and
    a plurality of pixels defined on the substrate,
    wherein the pixels include a plurality of sub pixels, and the sub pixels include:
       a common power line, a first drain electrode, and a second drain electrode each disposed on the substrate;
       a semiconductor pattern layer connected to the common power line and the second drain electrode;
       a gate electrode overlapping the semiconductor pattern layer; and
       an anode electrode connected to the second drain electrode,
    wherein the semiconductor pattern layer, the gate electrode and the first drain electrode all overlap.

12. The organic light emitting display device of claim 11, wherein the pixels include four sub pixels, and the four subpixels are collectively configured to emit each of a red color, a green color, a blue color, and a white color.

13. The organic light emitting display device of claim 11, wherein a channel area is formed in a region in which the semiconductor pattern layer and the gate electrode overlap, and the channel area completely overlaps the first drain electrode.

14. The organic light emitting display device of claim 11, wherein the common power line, the first drain electrode, and the second drain electrode are disposed on the same layer.

15. The organic light emitting display device of claim 11, wherein the anode electrode and the first drain electrode form a capacitor.

16. The organic light emitting display device of claim 11, wherein the gate electrode and the anode electrode are disposed on the same layer.

17. A method for manufacturing an organic light emitting display device, the method comprising:
    forming a common power line, a first drain electrode, and a second drain electrode on a substrate;
    forming a semiconductor pattern layer connected to the common power line and the second drain electrode;
    forming a gate electrode overlapping the semiconductor pattern layer; and
    forming an anode electrode connected to the second drain electrode,
    wherein the semiconductor pattern layer, the gate electrode and the first drain electrode all overlap.

18. The method of claim 17, wherein a channel area is formed in a region in which the semiconductor pattern layer and the gate electrode overlap, and the channel area completely overlaps the first drain electrode.

19. The method of claim 17, wherein the anode electrode and the first drain electrode form a capacitor.

20. The method of claim 17, wherein the gate electrode and the anode electrode are disposed on the same layer.

* * * * *